(12) United States Patent
Wu et al.

(10) Patent No.: US 7,105,856 B1
(45) Date of Patent: Sep. 12, 2006

(54) TEST KEY HAVING A CHAIN CIRCUIT AND A KELVIN STRUCTURE

(75) Inventors: Hsin-Chang Wu, Hsin-Chu (TW); Tzu-Chien Chuang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/907,404

(22) Filed: Mar. 31, 2005

(51) Int. Cl.
*H01L 29/10* (2006.01)
(52) U.S. Cl. .................. 257/48; 257/797; 257/E21.521; 324/763; 324/756; 324/158.1
(58) Field of Classification Search ..................... None
See application file for complete search history.

(56) References Cited

U.S. PATENT DOCUMENTS 5,514,974 A * 5/1996 Bouldin ..................... 324/763

* cited by examiner

*Primary Examiner*—Nathan J. Flynn
*Assistant Examiner*—Scott R Wilson
(74) *Attorney, Agent, or Firm*—Winston Hsu

(57) ABSTRACT

A test key formed on a semiconductor substrate has a plurality of electronic components, a plurality of conductors, a plurality of vias for connecting the electronic components and the conductors, a first pad, a second pad, a third pad, and a fourth pad. The first pad, the electronic components, the vias, the conductors, and the second pad connects in series to form a chain circuit, and the first pad and the second pad are positioned at two ends of the chain circuit. A Kelvin structure is composed of the third pad, the fourth pad, one of the conductors, one of the vias, and one of the electronic components.

6 Claims, 5 Drawing Sheets

TEST KEY HAVING A CHAIN CIRCUIT AND A KELVIN STRUCTURE

BACKGROUND OF INVENTION

1. Field of the Invention

The present invention relates to a test key in a semiconductor substrate, and more particularly, to a test key having a chain circuit and a Kelvin structure.

2. Description of the Prior Art

In semiconductor fabrication, a semiconductor device or an integrated circuit (IC) is continuously tested in every step so as to maintain device quality. Normally a testing circuit is simultaneously fabricated with an actual device so that the quality of the actual device is judged by the performance of the testing circuit. The quality of the actual device therefore is well controlled. Moreover, because of the advanced semiconductor technology, the number of transistors in a single chip is grown so that the amount of the vias for interconnecting the transistors is increased rapidly. In order to handle the yield of the semiconductor products, how to accurately measure the resistances of the vias has been an important issue.

Please refer to FIG. 1, which is a schematic diagram of a test key 10 according to the prior art. The test key 10 has a Kelvin structure that is used to measure the resistance of a via 12. The test key is formed on a semiconductor substrate and comprises a first pad 14, a second pad 16, a third pad 18, a fourth pad 20, and two wires 22, 24. The via 12 is connected with the four pad 14–20 via the two wires. When measuring the resistance of the via 12, four probes of a probe card are used to contact the four pads 14–20 respectively. The probe card provides a test current I to the test key 10 via the first pad 14 and the second pad 16. The test current I flows through the via 12. Meanwhile, the probe card measures the voltage gap between the two ends of the via 12 by contacting the third pad 18 and the fourth pad 20. Then, the resistance of the via 12 is calculated according to the test current I and the measured voltage gap between the two ends of the via 12. However, because of the single via 12, the test key 10 has etching loading effect.

Please refer to FIGS. 2–3. FIG. 2 is a layout diagram of another test key 30 according to the prior art, and FIG. 3 is sectional diagram of the test key 30. The test key 30 is formed on a semiconductor substrate and has a chain structure. The test key 30 comprises a first pad 32, a second pad 34, a plurality of electronic components 36, a plurality of conductors 38, and a plurality of vias 40. The conductors 38 are metal wires, and the electronic components 36 are diffusion areas or metal wires under the conductors 38. The vias 40 connect the first pad 32, the second pad 34, the electronic components 36, and the conductors 38 together. Therefore, the first pad 32, the electronic components 36, the conductors 38, the vias 40, and the second pad 34 are connected in series as a chain circuit. And, the first pad 32 and the second pad 34 are respectively positioned at the two ends of the chain circuit. When testing the test key 30, two probes of a probe card contact the first pad 32 and the second pad 34 to supply a test voltage to the first pad 32. Normally, as shown in FIG. 3, a test current I flows through the electronic components 36, the vias 40, and the conductors 38. The probe card measures the test current I so as to calculate the equivalent resistance between the first pad 32 and the second pad 34. And then, the probe card estimates the resistance of each via 40 according to the equivalent resistance between the first pad 32 and the second pad 34. Even the test key 30 has no etching loading effect, but the estimated resistance of each via 40 is not very accurate. The application of the estimated resistance of each via 40 is not very practical.

SUMMARY OF INVENTION

It is therefore a primary object of the present invention to provide a test key that has a chain circuit and a Kelvin structure to solve the above-mentioned problems.

A test key is formed on a semiconductor substrate and has a plurality of electronic components, a plurality of conductors, a plurality of vias for connecting the electronic components and the conductors, a first pad, a second pad, a third pad, and a fourth pad. The first pad, the electronic components, the vias, the conductors, and the second pad connects in series to form a chain circuit, and the first pad and the second pad are positioned at two ends of the chain circuit. A Kelvin structure is composed of the third pad, the fourth pad, one of the conductors, one of the vias, and one of the electronic components.

Because the test key has the Kelvin structure, the resistance of a single via can be measured accurately. In addition, the test key has the plurality of vias, so the test key has no etching loading effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
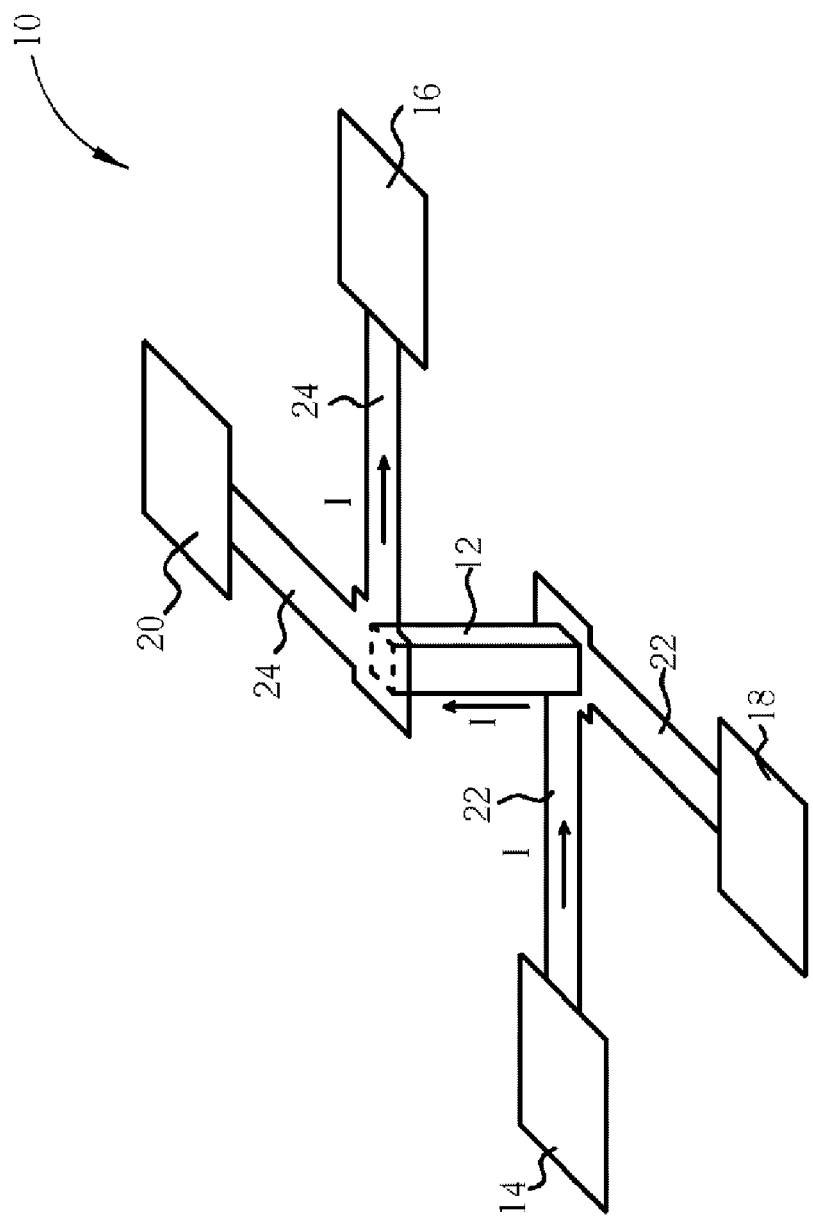
FIG. 1 is a schematic diagram of a test key according to the prior art.
Figure 2:
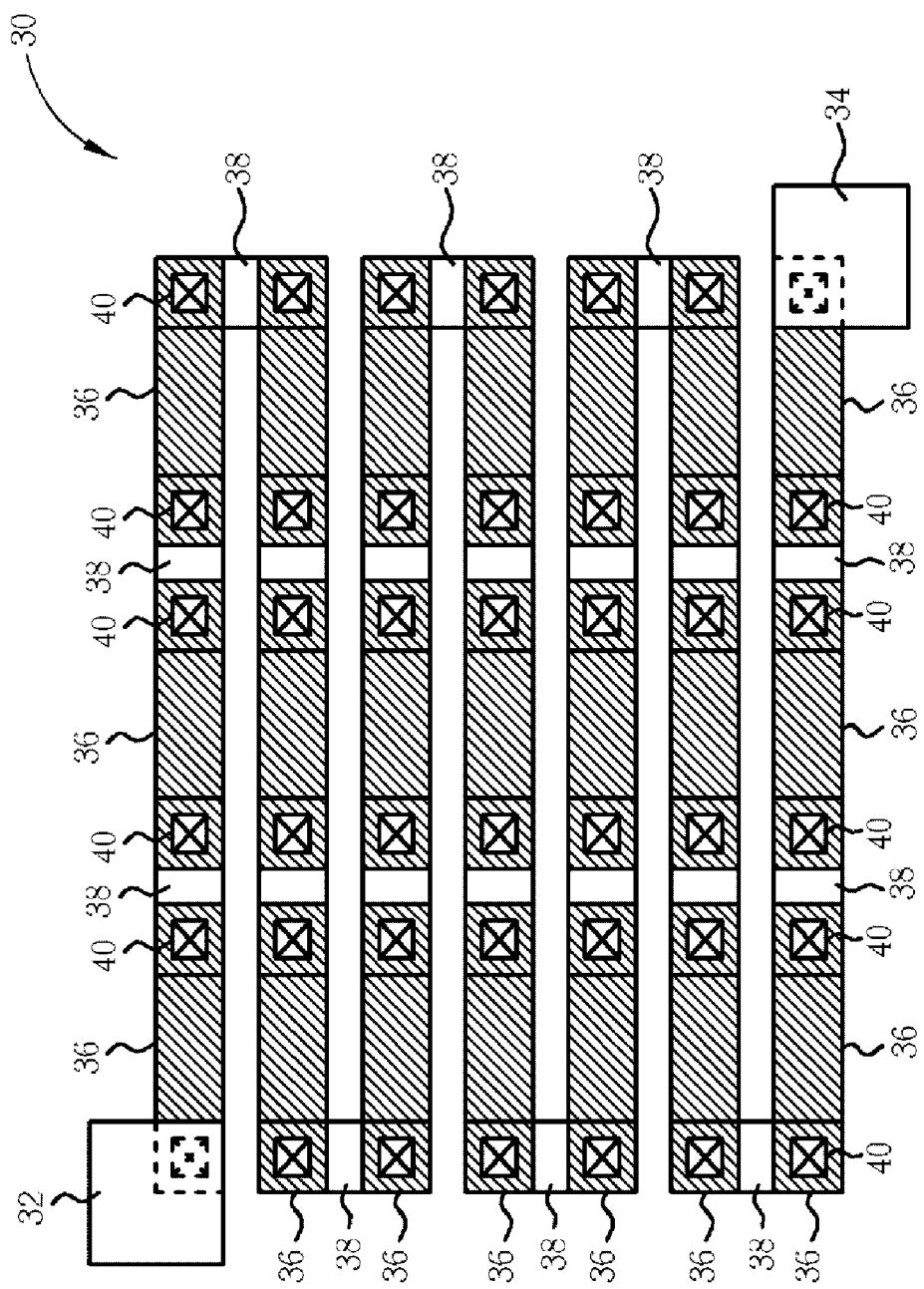
FIG. 2 is a layout diagram of another test key according to the prior art.
Figure 3:
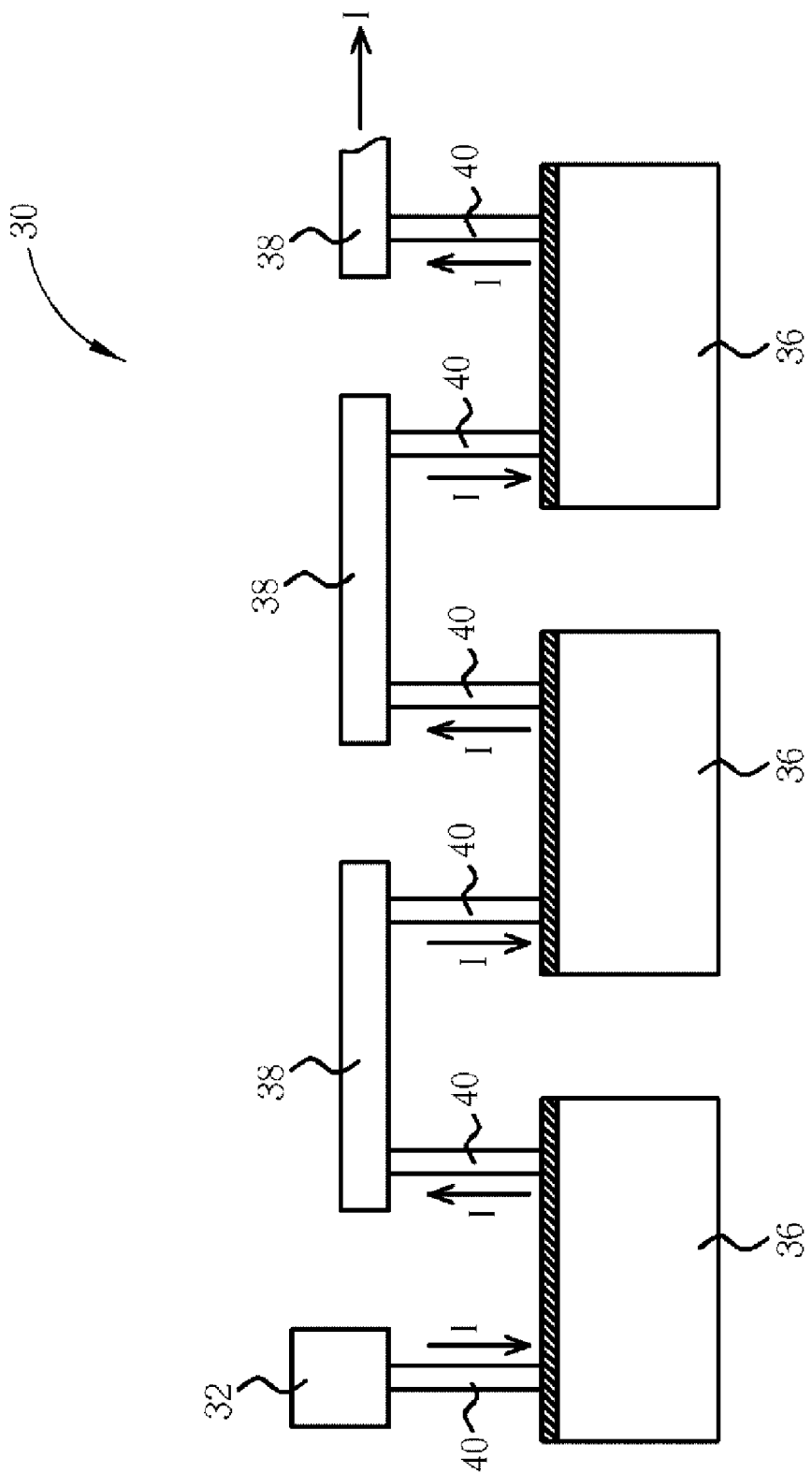
FIG. 3 is sectional diagram of the test key shown in FIG. 2.
Figure 4:
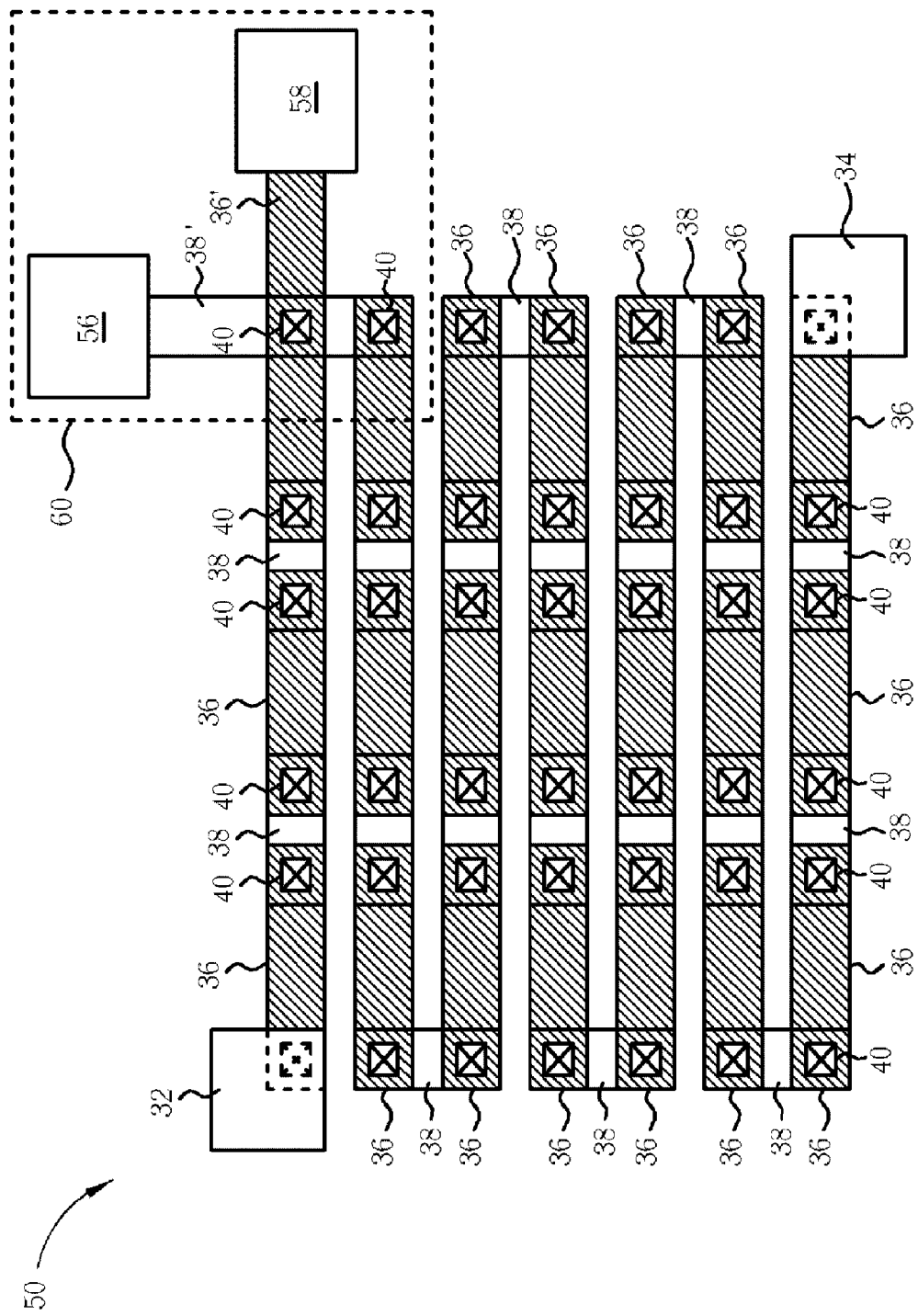
FIG. 4 is a layout diagram of the test key according to the present invention.
Figure 5:
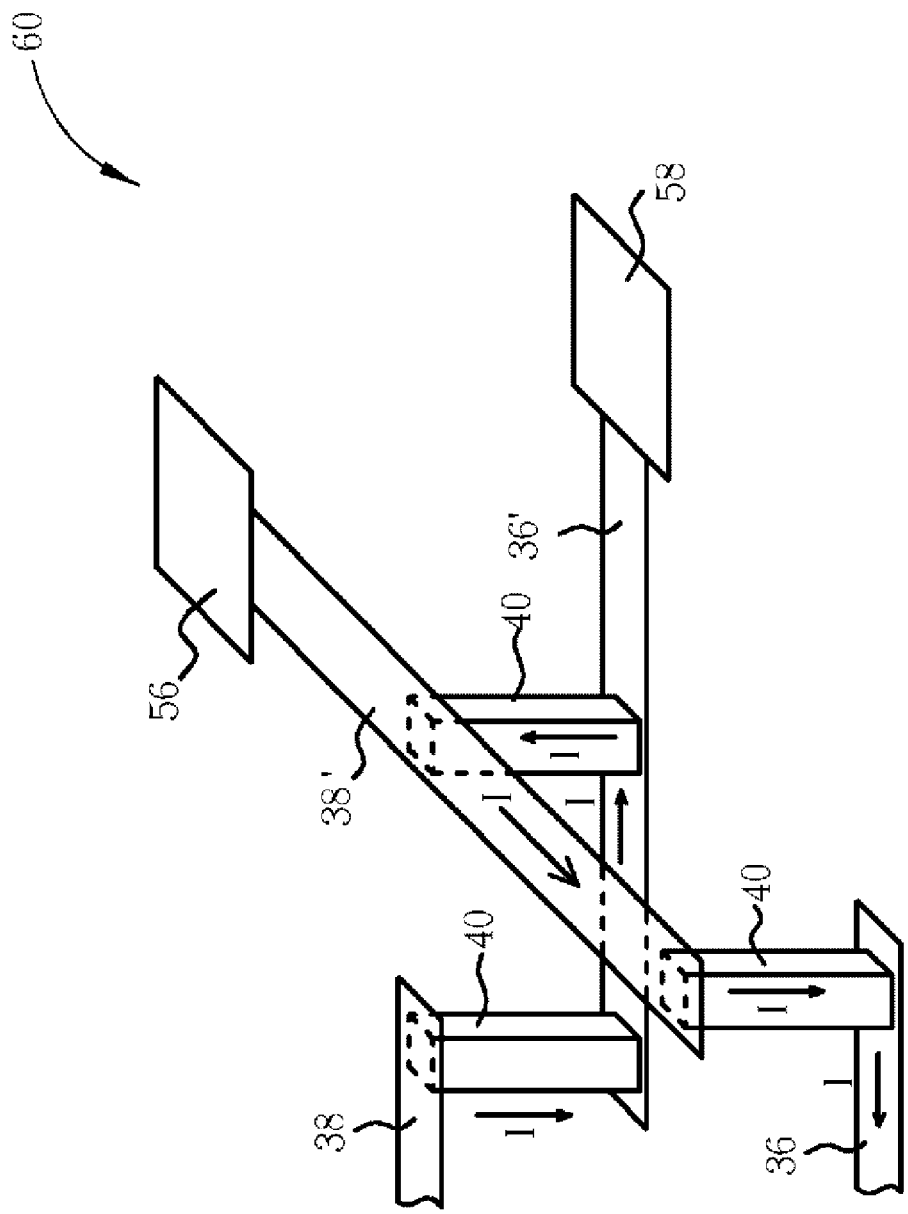
FIG. 5 is schematic diagram of a Kelvin structure of the test key shown in FIG. 4.

Please refer to FIGS. 4–5. FIG. 4 is the layout diagram of a test key 50 according to the present invention, and FIG. 5 is the schematic diagram of a Kelvin structure 60 of the test key 50. The key 50 has a similar circuit structure to the test key 30. The difference between the two test keys 30 and 50 is that a segment of the chain circuit of the test key 30 is replaced by the Kelvin structure 60 of the test key 50.

Similar to the test key 30, the test key 50 is also formed on a semiconductor substrate. The test key 50 comprises a first pad 32, a second pad 34, a third pad 56, a fourth pad 58, a plurality of electronic components 36–36', a plurality of conductor 38–38', and a plurality of vias 40. In the embodiment, the conductors 38 and 38' are metal wires, and the electronic components 36 and 36' are metal wires in a metal layer under the conductors 38 and 38'. It is noted that the present invention should not be limited in such case. For example, the electronic components 36 and 36' can be conductive diffusion areas. The vias 40 are used to connect the first pad 32, the second pad 34, the electronic components 36–36', and the conductors 38–38' in series to from a chain circuit. And the first pad 32 and the second 34 are respectively positioned at the two ends of the chain circuit.

As previously mentioned, a segment of the test key 30 is replaced by the Kelvin structure 60 of the test key 50. As shown in FIG. 5, the Kelvin structure 60 is composed of the third pad 56, the conductor 38', the electronic component 36', the fourth pad 58, and a specific via 40 that is connected with the electronic component 36' and the conductor 38'. The electronic component 36' is coupled to the pad 56, and the conductor 38' is coupled to the fourth pad 58.

When testing the test key 50, four probes of a probe card are used to contact the four pads 32, 34, 56, and 58. The probe card tries to output a test current I to the test key 50 via the first pad 32 and the second pad 34 to detect whether all components of the test key 50 are connected properly. If the test current I is successfully outputted to the test key 50, it is indicated that all components of the test key 50 are connected properly. In such situation, the test current I flows from the first pad 32 through the electronic components 36–36', the conductors 38–38', and the vias 40 to the second pad 34. However, if the probe card cannot output the test current I to the test key 50, it is indicated that all components of the test key 50 may be not connected properly. In other words, the path from the first pad 32 to the second pad 34 may be opened. In addition, the probe card measures the voltage gap between the two ends of the specific via 40, which is connected with the electronic component 36' and the conductor 38'. Then, the resistance of the specific via 40 can be accurately measured according to the voltage gap measured by the probe card. Therefore, because of the circuit structure of the test key 50, not only the resistance of a single via 40 can be measured accurately, but also any connection defect among the components of the test key 50 can be detected.

In comparison with the prior art, the test key according to the present invention has a Kelvin structure for accurately measuring the resistance of a single via. In addition, the etching loading effect can be avoided, and any connection defect among the components of the test key 50 can be detected. Therefore, in the same size of layout area, the test key according to the present invention is more functional.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A test key formed on a semiconductor substrate, the test key comprising:
   a plurality of electronic components formed in the semiconductor substrate;
   a plurality of conductors formed in a conductive layer;
   a plurality of vias for connecting the electronic components and the conductors;
   a first pad;
   a second pad, wherein the first pad, the electronic components, the vias, the conductors, and the second pad connect in series to form a chain circuit, and the first pad and the second pad are positioned at two ends of the chain circuit;
   a third pad electrically connected to a first end of a test via; and
   a fourth pad electrically connected to a second end of the test via;
   wherein the third and fourth pads of the test key measure a voltage gap between the first and second ends of the test via.

2. The test key of the claim 1 wherein the electronic components are diffusion areas formed in the semiconductor substrate.

3. The test key of the claim 1 wherein the conductors are made of metal material.

4. A test key formed on a semiconductor substrate, the test key comprising:
   a plurality of electronic components formed in the semiconductor substrate;
   a plurality of conductors formed in a conductive layer;
   a plurality of vias for connecting the electronic components and the conductors;
   a first pad;
   a second pad, wherein the first pad, the electronic components, the vias, the conductors, and the second pad connect in series to form a chain circuit, and the first pad and the second pad are positioned at two ends of the chain circuit;
   a third pad electrically connected to a first end of a test via through a test conductor; and
   a fourth pad electrically connected to a second end of the test via through a test electronic component;
   wherein the third and fourth pads of the test key measure a voltage gap between the first and second ends of the test via.

5. The test key of the claim 4 wherein the electronic components are diffusion areas formed in the semiconductor substrate.

6. The test key of the claim 4 wherein the conductors are made of metal material.

* * * * *